US012810186B2

(12) United States Patent
Miller, Jr.

(10) Patent No.: US 12,810,186 B2
(45) Date of Patent: Nov. 24, 2026

(54) QUDITS EMPLOYING NONLINEAR DIELECTRICS

(71) Applicant: UNIVERSITY OF HOUSTON SYSTEM, Houston, TX (US)

(72) Inventor: John H. Miller, Jr., Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 676 days.

(21) Appl. No.: 17/981,322

(22) Filed: Nov. 4, 2022

(65) Prior Publication Data

US 2023/0409945 A1 Dec. 21, 2023

Related U.S. Application Data

(60) Provisional application No. 63/275,528, filed on Nov. 4, 2021.

(51) Int. Cl.

*H10N 60/12* (2023.01)
*G06N 10/40* (2022.01)
*H10N 60/01* (2023.01)

(52) U.S. Cl.

CPC ......... *G06N 10/40* (2022.01); *H10N 60/0912* (2023.02); *H10N 60/12* (2023.02)

(58) Field of Classification Search

CPC ............... H10N 69/00; H10N 60/0912; H10N 60/12–126; H10N 99/05; G06N 10/40; H10D 1/64; H10D 1/60–716

See application file for complete search history.

(56) References Cited

U.S. PATENT DOCUMENTS

2011/0058305 A1* 3/2011 Taki ......................... H01G 4/33 361/321.5
2018/0013052 A1 1/2018 Oliver et al.
(Continued)

OTHER PUBLICATIONS

International Search Report and Written Opinion mailed Nov. 6, 2023 and issued in corresponding PCT application No. PCT/US2022/049041. 9 pages.
(Continued)

*Primary Examiner* — Shahed Ahmed
(74) *Attorney, Agent, or Firm* — Blank Rome LLP

(57) ABSTRACT

The disclosed qudits interchange the roles of linear and nonlinear in the nonlinear LC resonators formed by existing superconducting qudits. The disclosed qudits include a non-linear capacitor (e.g., a material that forms charge density waves, a material that forms spin density waves, a ferro-electric material, an incipient ferroelectric material, or a quantum paraelectric material) coupled to a linear or nearly linear inductance (e.g., a high temperature superconductive coil, an array of Josephson junctions in series, etc.). The disclosed qudits can operate at significantly higher temperatures than existing quantum computing technologies due to reduced quasiparticle poisoning and collective quantum behavior that enhance thermal robustness. The disclosed qudits are also easier to manufacture uniformly at scale than existing qubits. Finally, the disclosed qudits are also compatible with many of the gating, coupling, readout, and pulse-sequence methodologies that have already been developed for existing superconducting qubits.

20 Claims, 7 Drawing Sheets

(56) References Cited

U.S. PATENT DOCUMENTS

| | | | | |
|---|---|---|---|---|
| 2021/0184673 | A1* | 6/2021 | Le Guevel | H03K 17/92 |
| 2025/0040454 | A1* | 1/2025 | Swenson | B82Y 10/00 |

OTHER PUBLICATIONS

Davidovikj, D. et al. "Quantum paraelectricity probed by superconducting resonators." Retrieved from the internet. <URL: https://arxiv.org/pdf/1607.08146.pdf. pp 1-19.

Neeley, M. et al. "Emulation of a Quantum Spin with a Superconductiong Phase Qudit." Science 325, 722 (2009) Retrieved from the internet. https://www.science.org/doi/10.1126/science.1173440. 5 pages.

Sala, A. et al. "Proposal for a transmon-based quantum router." Retrieved from the internet. https://https://arxiv.org/pdf/1509.05768.pdf. pp 1-14.

* cited by examiner

QUDITS EMPLOYING NONLINEAR DIELECTRICS

CROSS-REFERENCE TO RELATED APPLICATIONS

This application claims priority to U.S. Prov. Pat. Appl. No. 63/275,528, filed Nov. 4, 2021, which is hereby incorporated by reference.

FEDERAL FUNDING

None

BACKGROUND

A qubit (or quantum bit) is a two-state (or two-level) quantum-mechanical system. In quantum computing, a qubit is a basic unit of quantum information—the quantum version of a binary bit physically realized with a two-state device. While qubits are 2-level quantum systems, it is possible to also define quantum computation with higher dimensional systems (e.g., a qutrit has three levels or dimensions, a ququrit has dimension four levels or dimensions, etc.). A qudit is a generalization of a qubit to a d-level or d-dimension system.

Quantum computing is a type of computation whose operations can harness the phenomena of quantum mechanics, such as superposition, interference, and entanglement. While existing quantum computers are too small to outperform classical computers for practical applications, larger realizations are believed to be capable of solving certain computational problems (e.g., the integer factorization that underlies RSA encryption) substantially faster than classical computers. Because of their potential, quantum computers have generated enormous interest and influx of funds from federal agencies, private venture capital, and large companies.

Superconducting qubits generally consist of superconducting electrodes that are interconnected by Josephson junctions (JJ), which consist of two or more superconductors coupled by a weak link (e.g., a thin insulating barrier, a short section of non-superconducting metal, or a physical constriction that weakens the superconductivity at the point of contact). When placed in proximity with the barrier or restriction between them, the superconductors produce a current (known as a supercurrent) that flows continuously across the Josephson junction without any voltage applied, a phenomenon referred to as the Josephson effect.

The most widely used superconducting qubit is the transmon, which consists of a Josephson junction coupled to a capacitive element. The nonlinear inductance of the Josephson junction and linear capacitance form a nonlinear LC resonator. That anharmonicity enables unequal spacing between quantized energy levels when cooled, enabling the lowest two energy levels to represent $|0\rangle$ and $|1\rangle$ qubit states (as described below with reference to FIGS. 1 through 2C). The fluxonium, which is closely related to the transmon, includes a series array of Josephson junctions that add a linearized kinetic inductance to the circuit. An extensive array of qubit readout, coupling, gating, and pulse sequence methodologies have been developed for transmon-based and fluxonium-based quantum computers. That progress has enabled the fabrication and testing of Google's Sycamore processor, a quantum computer with 53 functioning qubits that, when cooled to a temperature below 20 milli-Kelvin (mK), has demonstrated quantum supremacy over classical supercomputers for certain computational tasks.

Ultimately, it is desirable for quantum computers to outperform and replace many of the conventional computing devices currently utilized in institutions, offices, aircraft, spacecraft, ships, and even certain types of vehicles. Existing qudits, however, have a number of drawbacks that prevent the scalable manufacturing and wider adoption of quantum computers. Most notably, existing quantum computers must be cooled to a temperature below 20 mK to reduce thermally-induced decoherence of the quantum superpositions of qubit states. As a result, existing quantum computers require with very large, expensive dilution refrigerators, making existing quantum computers look much like old mainframe computers. Existing quantum computers are also fairly noisy, often referred to as "Noisy Intermediate Scale Quantum (NISQ)" technology. Additionally, existing quantum computers require insulating barriers in Josephson junctions that are extremely thin (approximately 1.8 nm), make it difficult to achieve the uniformity necessary for scalable manufacturing.

Accordingly, there is a critical need for quantum information processing devices that do not require cooling to milli-Kelvin temperatures. Additionally, there is a need for quantum information processing devices that can be manufactured easily and uniformly at scale. Finally, it would be preferable if those (more thermally robust and/or more easily manufacturable) quantum information processing devices were compatible with at least some of the extensive number of methodologies that have already been developed for qubit readout, coupling, gating, and pulse sequencing.

SUMMARY

The disclosed qudits interchange the roles of linear and nonlinear in a nonlinear LC resonator. The disclosed qudits include a nonlinear capacitor (e.g., a material that forms charge density waves, a material that forms spin density waves, a ferroelectric material, an incipient ferroelectric material, or a quantum paraelectric material) coupled to a linear or nearly linear inductance. The inductance may be a superconductive film patterned on a substrate to form a loop, an array of Josephson junctions in series, etc. The disclosed qudits can operate at significantly higher temperatures than existing quantum computing technologies due to reduced quasiparticle poisoning and collective quantum behavior that enhance thermal robustness. The disclosed qudits are also easier to manufacture uniformly at scale than existing qubits. Finally, the disclosed qudits are also compatible with many of the gating, coupling, readout, and pulse-sequence methodologies that have already been developed for existing superconducting qubits.

BRIEF DESCRIPTION OF THE DRAWINGS

Aspects of exemplary embodiments may be better understood with reference to the accompanying drawings. The components in the drawings are not necessarily to scale, emphasis instead being placed upon illustrating the principles of exemplary embodiments.

DETAILED DESCRIPTION

Figure 1:
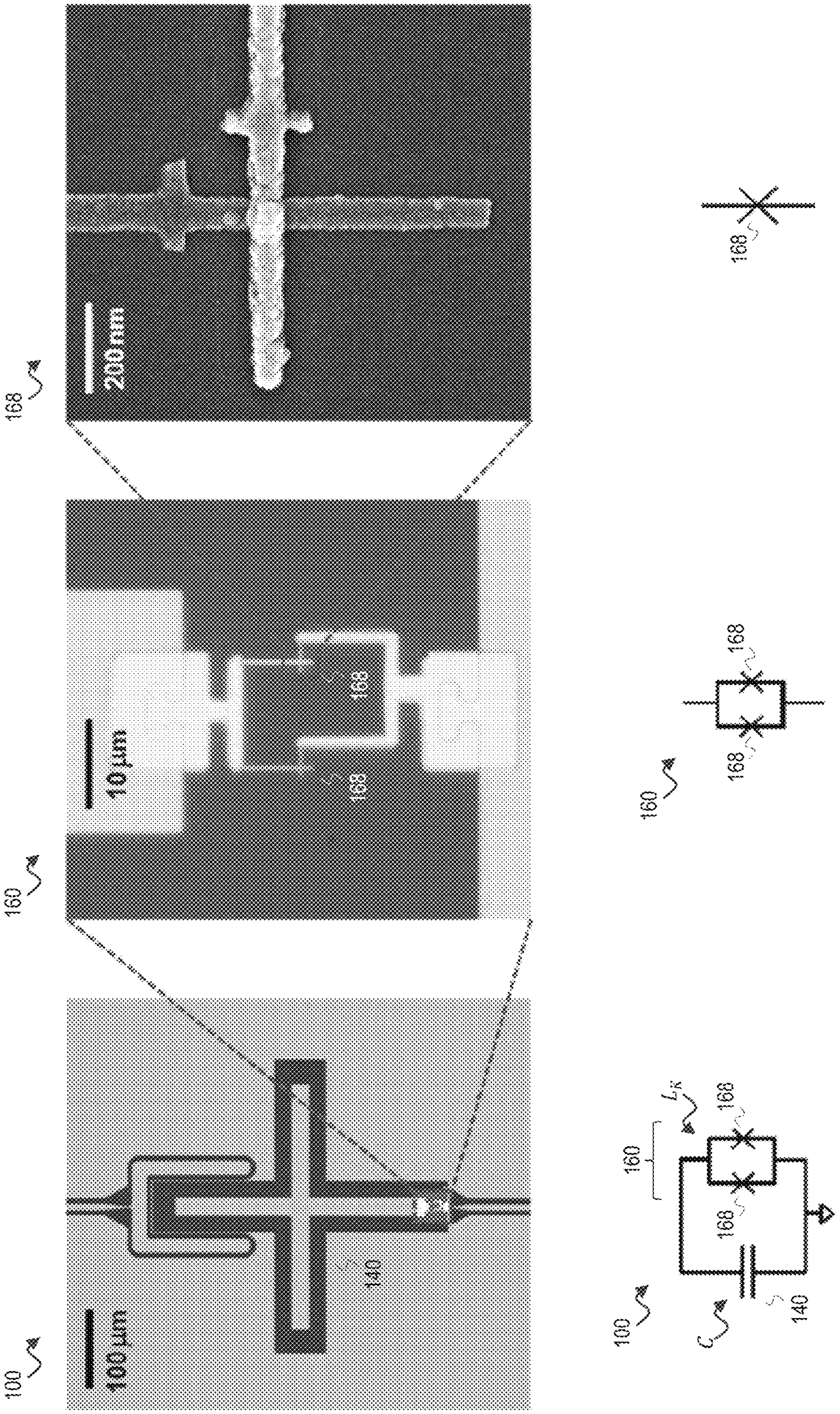
FIG. 1 (PRIOR ART)
FIG. 1 are images and a circuit model of an example transmon-based cubit.

Reference to the drawings illustrating various views of exemplary embodiments is now made. In the drawings and the description of the drawings herein, certain terminology is used for convenience only and is not to be taken as limiting the embodiments of the present invention. Furthermore, in the drawings and the description below, like numerals indicate like elements throughout.

The Transmon

FIG. 1 are images and a circuit model of an example transmon-based cubit 100, which includes a capacitor 140 (having a capacitance C) in parallel with one or more Josephson junctions 168. The one or more Josephson junctions 168 act a nonlinear inductor due to their nonlinear kinetic inductance $L_K$ resulting from the periodic Josephson coupling energy, forming a nonlinear LC resonator and creating the equivalent of a quantum anharmonic oscillator. That anharmonicity enables unequal spacing between quantized energy levels when cooled, enabling the lowest two energy levels to represent |0> and |1> qubit states (for example, as shown in FIG. 2C and described below).

To be able to tune the operating characteristics of the overall system, the example transmon-based cubit 100 of FIG. 1 includes two similar Josephson junctions 168 in parallel (as opposed to using a single Josephson junction 168). The two Josephson junctions 168 form a superconducting loop, often referred to as a superconducting quantum interference device (SQUID) 160, which allows the effective Josephson energy of the overall circuit to be tuned through the application of an external magnetic flux Φ.

Qubit Readout, Coupling, Gating, and Pulse-Sequence Methodologies

Figure 2A:
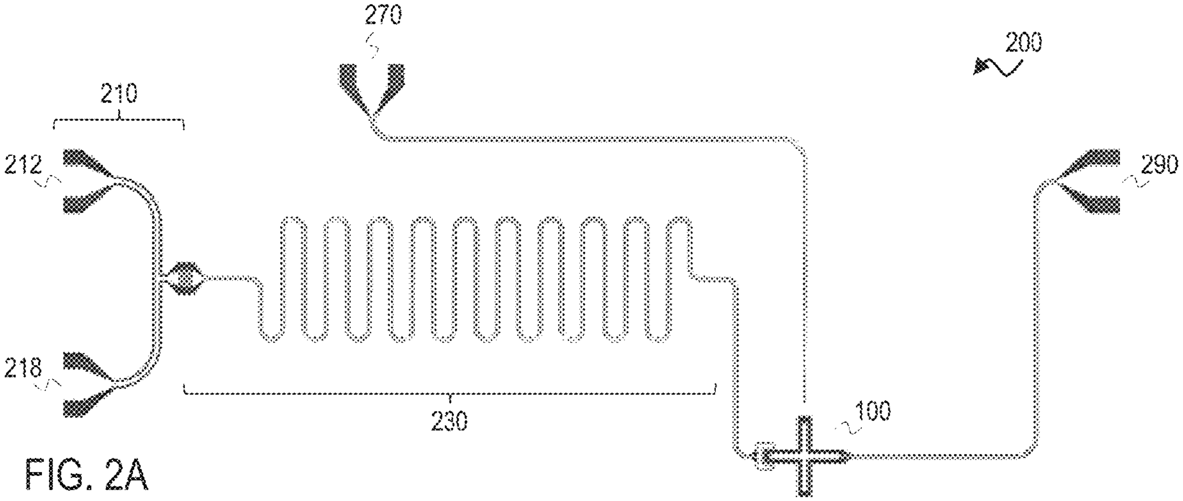
FIG. 2A (PRIOR ART)
FIG. 2A is an example transmon device.
Figure 2B:
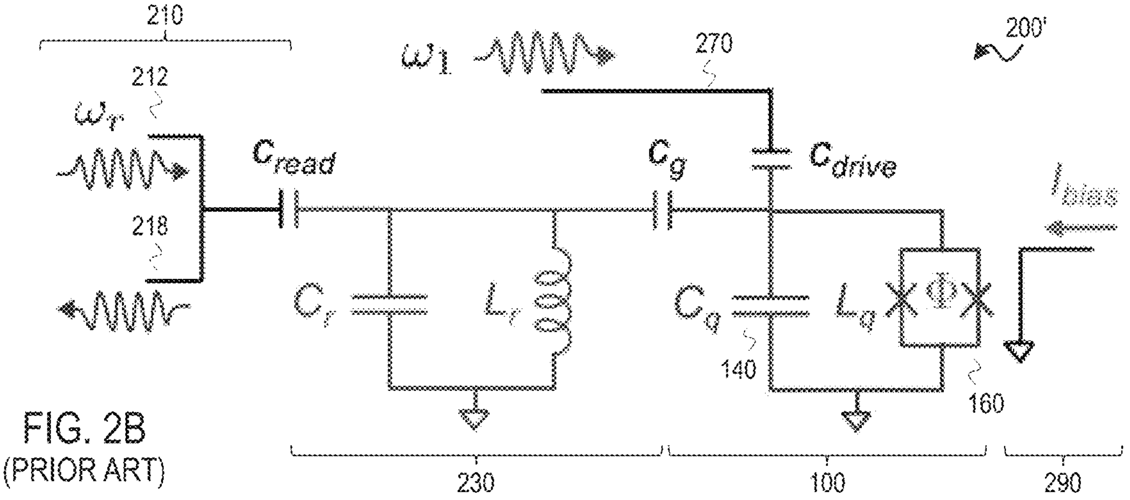
FIG. 2B (PRIOR ART)
FIG. 2B is an equivalent lumped element circuit model of the example transmon device of FIG. 2A.
Figure 2C:
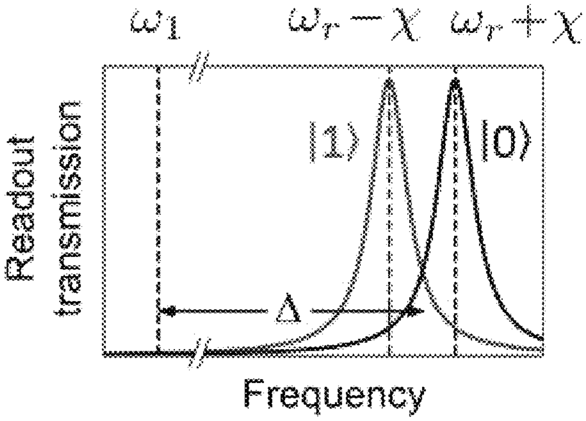
FIG. 2C (PRIOR ART)
FIG. 2C are transmission measurements made between the readout ports of the example transmon device of FIG. 2A.

FIG. 2A is an example transmon device 200, including readout ports 210 (i.e., a readout input port 212 and a readout output port 218), a readout resonator 230, a qubit drive line 270, a transmon 100, and a flux bias line 290. FIG. 2B is an equivalent lumped element circuit model 200' of the example transmon device 200 of FIG. 2A. FIG. 2C is a graph showing state-dependent transmission spectra between the readout ports 210 of the example transmon device 200.

In the example transmon device 200, the flux bias line 270 is used to apply a magnetic flux Φ to the SQUID 160 of the transmon 100 to change the operating frequency of the transmon 100. The qubit drive line 270 is used to modify the state of the qubit by applying a microwave drive pulse with a center frequency matching the operating frequency of the transmon 100. If the transmon 100 starts in its ground state, an appropriately designed microwave drive pulse can be used to raise the transmon to its excited state or to place it in some superposition of the transmon's ground and excited states. Further microwave drive pulses can be applied along the qubit drive line 270 to modify the state of the transmon 100 as needed throughout the course of executing a quantum algorithm. To determine the state of the transmon 100 after executing a quantum algorithm, the example transmon device 200 uses a common method known as dispersive readout. The state of the transmon 100 (e.g., if it is in its ground or excited state) modifies the resonant frequencies of the readout resonator 230, which can be monitored via microwave spectroscopy in the form of transmission measurements made between the readout ports 210 as shown in FIG. 2C.

In addition to the simple example transmon device 200 of FIGS. 2A-2C, an extensive array of qubit readout, coupling, gating, and pulse sequence methodologies have been developed for transmon-based and fluxonium-based quantum computers.

The Fluxonium

Figure 3:
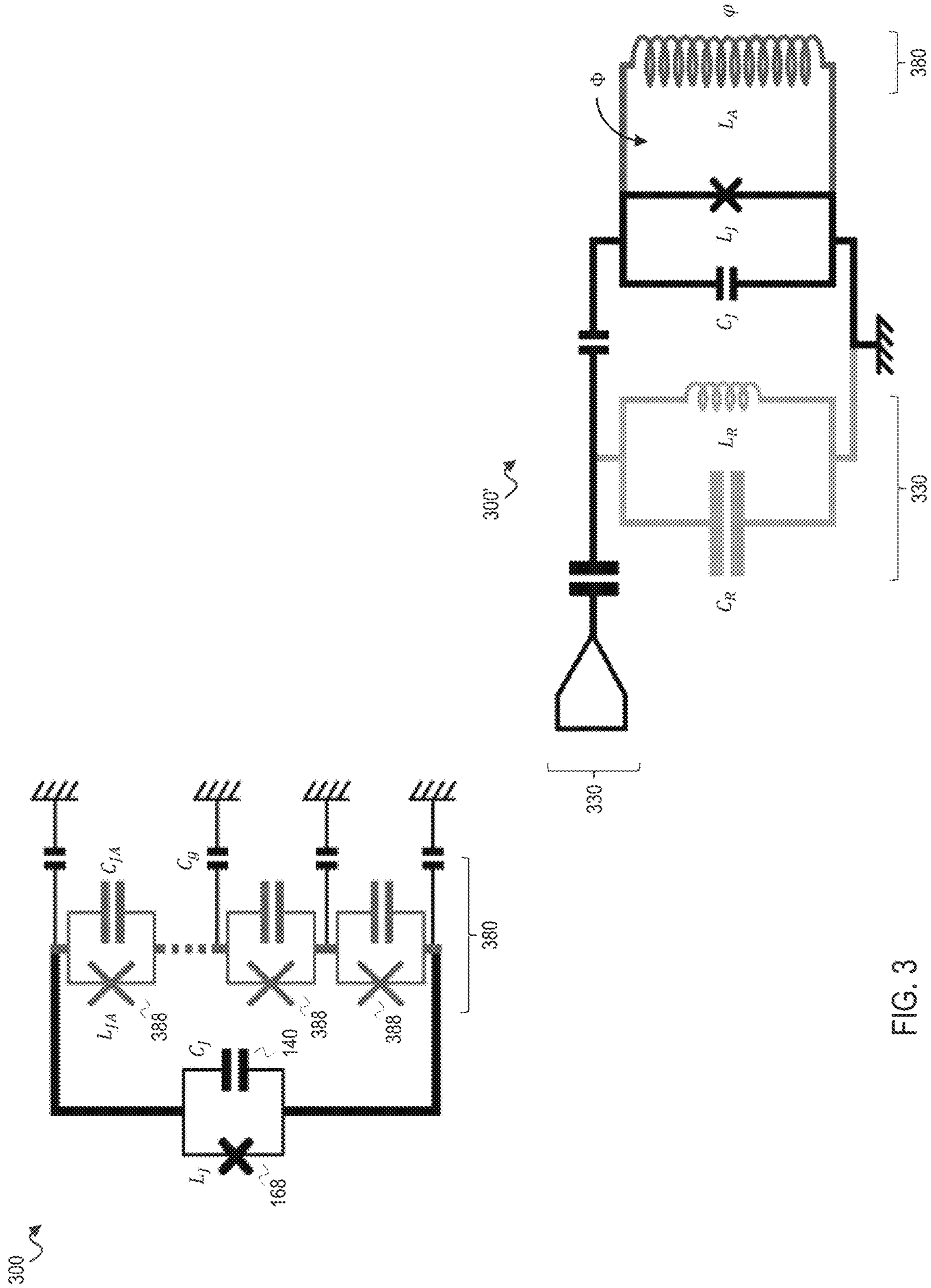
FIG. 3 (PRIOR ART)
FIG. 3 is a diagram and a simplified circuit model of an example fluxonium.

FIG. 3 is a diagram of an example fluxonium 300 and a simplified circuit model 300' of the example fluxonium 300. The example fluxonium 300 includes a Josephson junction 168 having a Josephson inductance $L_J$ and a capacitive element 140 having a capacitance $C_J$, shunted by the array 380 of larger Josephson junctions 388 having an inductance $L_{JA}$ and capacitance $C_{JA}$. Islands formed between the larger Josephson junctions 388 of the array 380 have a small capacitance $C_g$ to ground. The simplified circuit model 300' includes the circuit equivalent of a Cooper pair box (with a small capacitance $C_J$ and non-linear Josephson inductance $L_J$) capacitively coupled (with capacitance $C_c$) to a probe 330 such that $(L_J/C_J)^{1/2}>h/(2e)^2$. The array 380 provides a giant inductance $L_A>>L_J$. A parallel combination of $C_R$ and $L_R$ such that $(L_R/C_R)^{1/2}\approx\Omega<<h/(2e)^2$ is the circuit model for a distributed transmission line resonator 330. The series array 300 of Josephson junctions 388 add a linearized kinetic inductance $L_{JA}$ to the circuit and provide a reduced flux φ.

Qubits Employing Nonlinear Dielectric Materials

Figure 4:
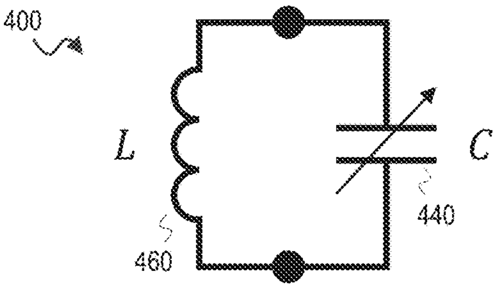
FIG. 4 is a schematic illustrating a qubit employing nonlinear dielectric materials according to exemplary embodiments.

FIG. 4 is a schematic illustrating a qubit 400 employing nonlinear dielectric materials according to exemplary embodiments. As described in detail below, the qubit 400 forms a nonlinear LC circuit in which the roles of linear and nonlinear elements are reversed relative to the transmon qubit 100 described above.

As shown in FIG. 4, the qubit 400 includes a nonlinear capacitive material 440 and a linear (or nearly linear) inductance 460. The nonlinear capacitive material 440 may be, for example, a material that forms charge density waves (CDWs) or spin density waves (SDWs), ferroelectric material, incipient ferroelectric material, quantum paraelectric material, or other system with nonlinear dielectric properties. Suitable charge density wave materials with complete Peierls gaps and underdamped charge density wave response at low temperatures include, for example, $(TaSe_4)_2I$, $K_{0.3}MoO_3$ (blue bronze), and monoclinic $TaS_3$. Ferroelectric, incipient ferroelectric, and quantum paraelectric materials with nonlinear dielectric properties include, for example, $BaTiO_3$, $Ba_{0.5}Sr_{0.5}TiO_3$, $KTaO_3$, and $SrTiO_3$ (STO).

Figure 5:
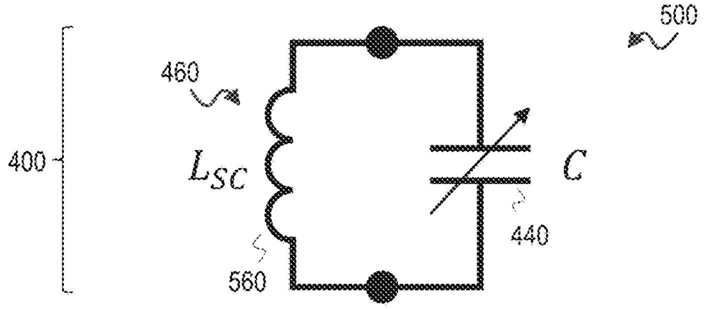
FIG. 5 is a schematic illustrating a nonlinear dielectric-superconductor qubit according to another exemplary embodiment.

FIG. 5 is a schematic illustrating wherein the qubit 400 is a nonlinear dielectric-superconductor qubit 500 according to an exemplary embodiment. In the ND-superconductor qubit 500 of FIG. 5, the nonlinear capacitive material 440 is coupled to a superconducting inductor 560 having an inductance $L_{SC}$. The superconducting inductor 560 may be, for example, a planar high temperature superconducting (HTS) coil (having a much higher $T_c$ than materials used in existing quantum computing devices) or a linear array 380 of Josephson junctions 388 that, due to its kinetic inductance, acts as a linear or nearly linear inductor as described above.

Figure 6:
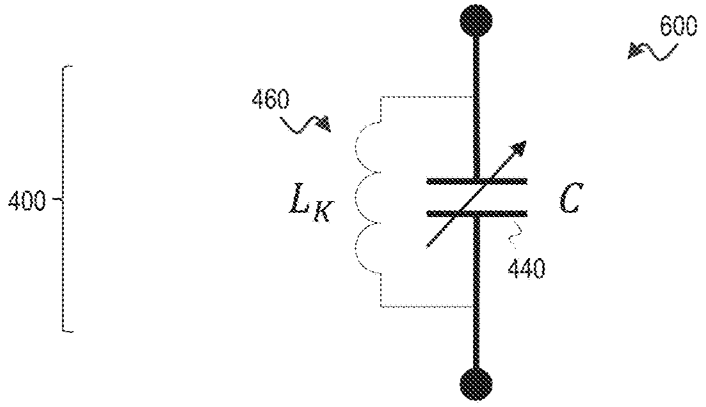
FIG. 6 is a schematic illustrating a nonlinear dielectric qubit according to an exemplary embodiment.

FIG. 6 is a schematic illustrating an embodiment wherein the qubit 400 is a nonlinear dielectric (ND) qubit 600 according to another exemplary embodiment. In the ND qubit 600 of FIG. 6, the inductance 460 is the intrinsic kinetic inductance $L_K$ of the nonlinear capacitive material 440 (for example, due to the inertial response of charge density wave or spin density wave electrons). Accordingly, in the embodiment of FIG. 6, no external inductor needs to be attached to the nonlinear capacitive material 440 and the nonlinear dielectric qubit 600 can be coupled (e.g., capacitively, inductively, or by more complex methods) to other elements in a quantum computer.

Figure 7:
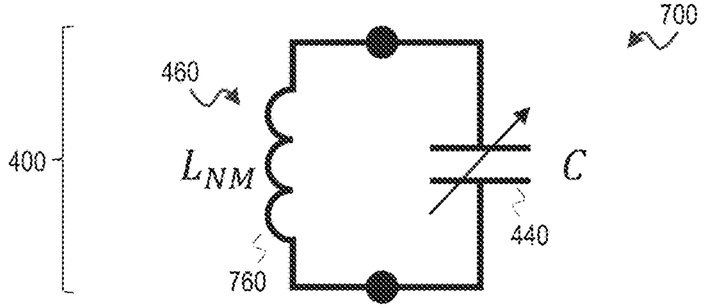
FIG. 7 is a schematic illustrating a nonlinear dielectric-normal metal qubit according to another exemplary embodiment.

FIG. 7 is a schematic illustrating an ND-normal metal qubit 700 according to another exemplary embodiment. In the ND-normal metal qubit 700 of FIG. 7, the nonlinear capacitive material 440 is coupled to a cooled, non-superconducting metal inductor 760 having an inductance $L_{NM}$.

The disclosed qubits 400 take advantage of the fact that certain systems act as nonlinear capacitors at low temperatures. Charge density waves and spin density waves, for example, provide nonlinear capacitance due to their nonlinear periodic pinning energy. (Other nonlinear dielectric materials include quantum paraelectrics and ferroelectrics.) In particular, charge density waves (correlated electron-phonon systems with high transition temperatures, some well above the boiling point of water) show collective electron transport at the highest known temperatures at ambient pressure.

Materials with very high charge density wave transition temperatures include the ribbon-like quasi-1D linear chain compounds such as $K_{0.3}MoO_3$ (blue bronze, 180 K), orthorhombic $TaS_3$ (215-218 K), $(TaSe_4)_2I$, (263-265 K), and $NbS_3$ (475 K), as well as the quasi-2D layered compound 1T-$TaS_2$ (545 K). Importantly, the high transition temperatures are accompanied by large Peierls energy gaps, which are orders of magnitude larger than the Bardeen-Cooper-Schrieffer (BCS) energy gap of the superconducting aluminum used in existing commercial superconducting quantum computers. When cooled, those large Peierls gaps suppress a decoherence effect known as quasiparticle poisoning and enable the disclosed qubits 400 to function at significantly higher temperatures than existing qubits like the transmon 100, the fluxonium 200, etc.

Figure 8:
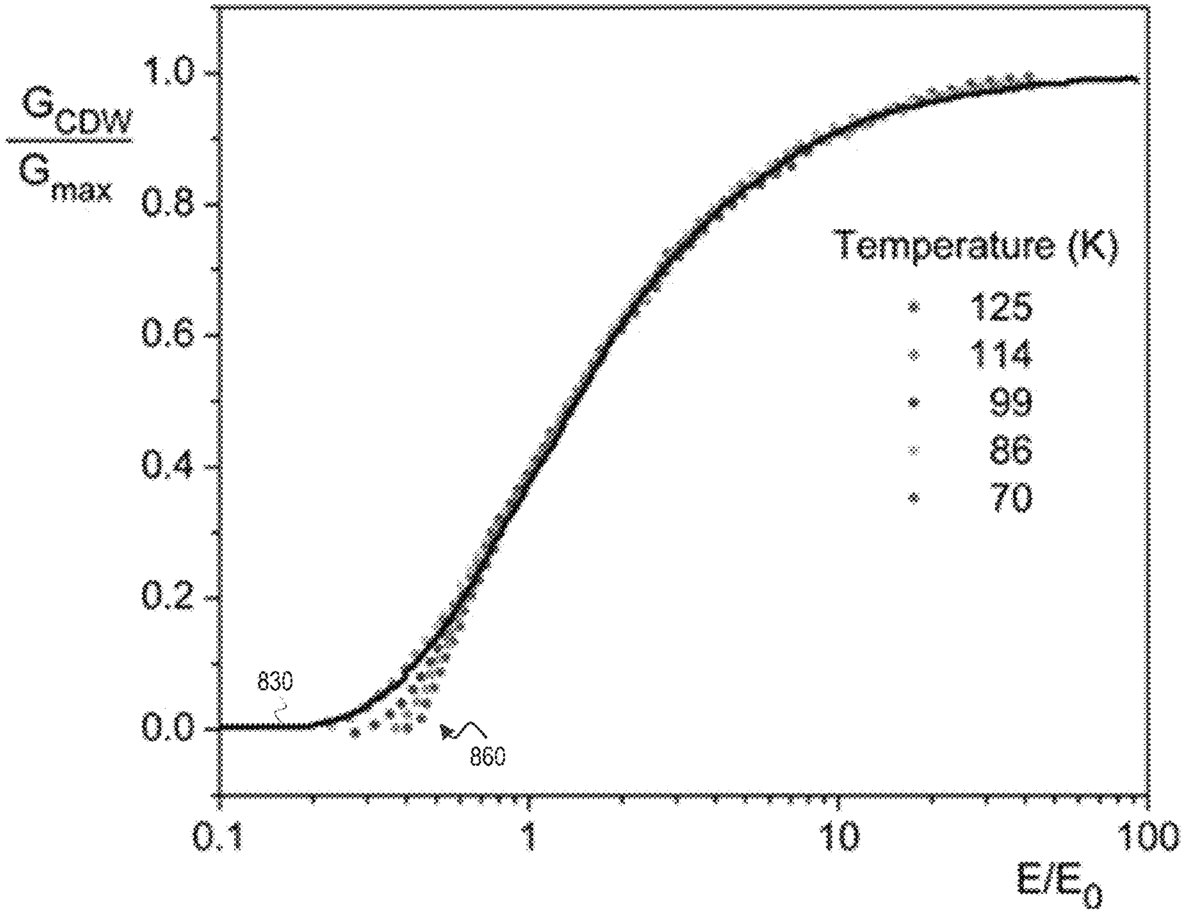
FIG. 8 is a conductance vs. applied electric field graph.

Charge density waves exhibit a number of quantum behaviors. As shown in the conductance vs. applied electric field graph of FIG. 8, for example, Aharonov-Bohm (AB) quantum oscillations 860 of period h/2e that are similar to the quantum Zener tunneling current-voltage (I-V) curve 830, exp $[-E_0/E]$, have been found in the magneto-conductance of charge density wave crystals with columnar defects (and similar AB oscillations 860 have been observed in charge density wave rings of $TaS_3$). Some charge density waves show switching effects at up to 79 K in temperature, suggesting transitions between macroscopically distinct quantum states.

Figure 9:
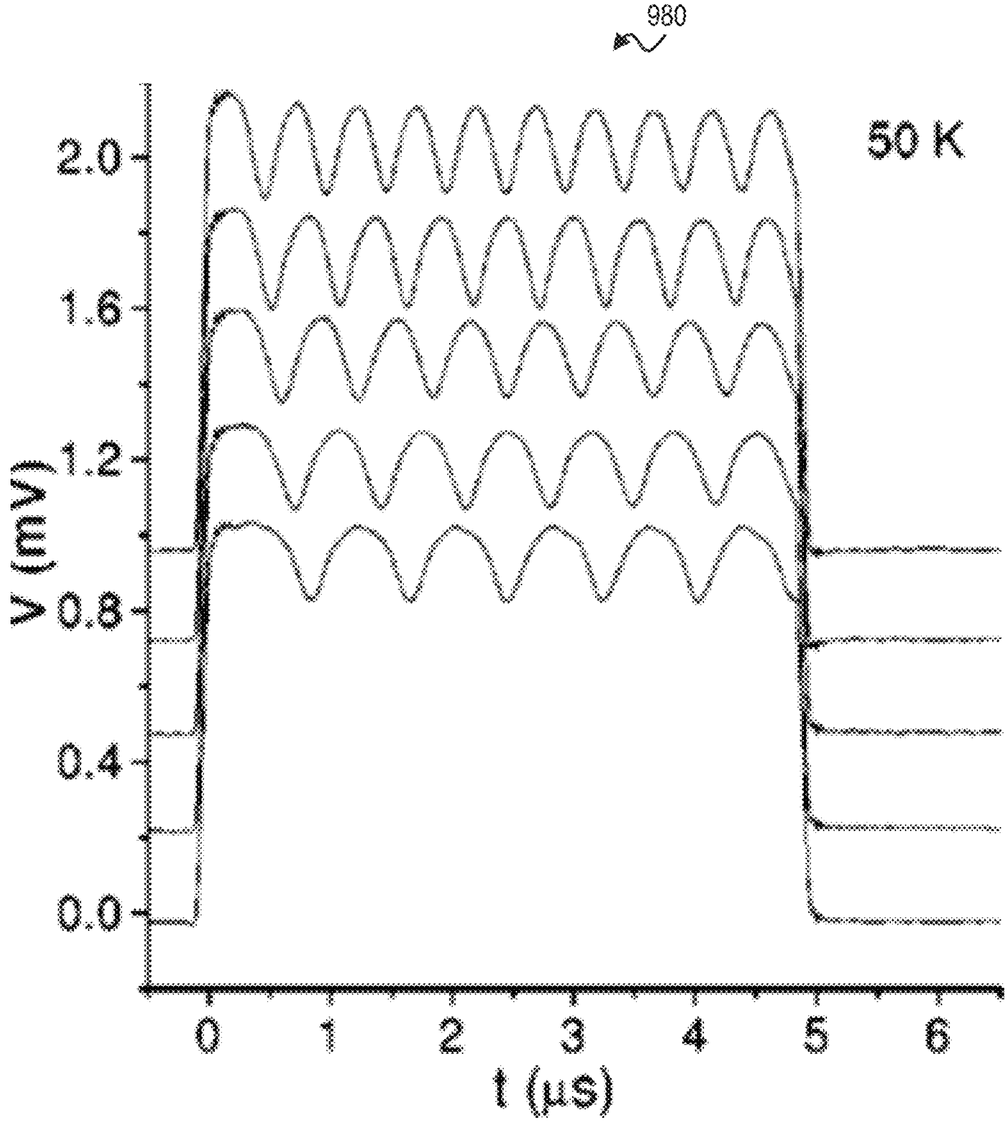
FIG. 9 is a graph illustrating a pulse-duration memory effect (PDME).

Several charge density wave systems also show evidence for quantum behavior and learning. FIG. 9, for instance, shows a pulse-duration memory effect (PDME) 980 for a ribbon-like $NbSe_3$ crystal at 50 K. After training, the final charge density wave voltage oscillation always finishes at a minimum, as if the charge density wave knew the rectangular pulse length (5 μs, in the example of FIG. 9) beforehand. Only one or a few pulses are needed to train the charge density wave, in contrast to the hundreds or thousands of pulses required in classical simulations. That extremely rapid learning suggests a form of intrinsic quantum artificial intelligence.

While this disclosure is largely directed to qubits 400, the benefits of nonlinear capacitive materials 440 and other features described herein are similarly applicable to qutrits and other higher level qudits.

It is possible to fabricate a quantum computing chip—including coupled qubits 400, resonators 230, and readout elements 210—by employing appropriate film deposition, doping, and lithographic techniques such as photolithography, e-beam lithography, and focused ion beam lithography. For the ND-superconducting qubit 500, superconductors that may be used to form the superconducting inductor 560 include any high-$T_c$ a superconductor, such as a cuprate (e.g., YBCO) or iron-based superconductor (e.g., FeSe), or any moderate- or low-$T_c$ superconductor, such as $MgB_2$, NbTi, or Nb. Aluminum, the superconductor used in current transmon-based quantum computers, can be employed if necessary. In such cases, the ND-superconducting qubit 500 can be used in conjunction with transmons 100, fluxoniums 300, resonators, and other elements based on current technology. Although the ND-superconducting qubit 500 will then need to be cooled to very low temperatures, the voltage tunability of the ND-superconducting qubit 500 offers expanded possibilities (for example, a voltage-tunable coupling capacitor between qubit devices).

Figure 10:
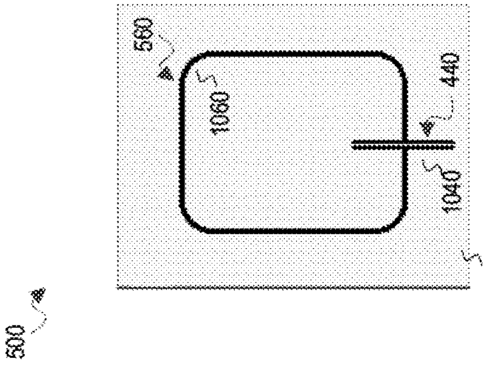
FIG. 10 is a top-down view of an ND-superconducting qubit having a single-loop inductor and a simple nonlinear capacitor according to an exemplary embodiment.
Figure 11:
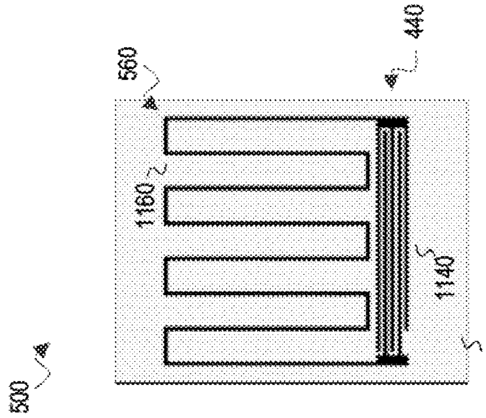
FIG. 11 is a top-down view of an ND-superconducting qubit having a meandering inductor and an interdigitated nonlinear capacitor according to an exemplary embodiment.

FIG. 10 is a top-down view of an ND-superconducting qubit 500 according to an exemplary embodiment where the superconducting inductor 560 is a single-loop inductor 1060 patterned on a substrate 1001 and the nonlinear capacitor 440 is a simple nonlinear capacitor 1040. FIG. 11 is a top-down view of an ND-superconducting qubit 500 according to an exemplary embodiment where the superconducting inductor 560 is a meandering inductor 1160 and the nonlinear capacitor 440 is an interdigitated nonlinear capacitor 1140. Use of very thin superconducting lines 560 increases kinetic inductance, which scales inversely with cross-sectional area when the thickness is smaller than the London penetration length. (FIGS. 10-17 are not to scale. Instead, the width of the superconducting lines 560, gaps, etc. are exaggerated for clarity.)

Figure 12:
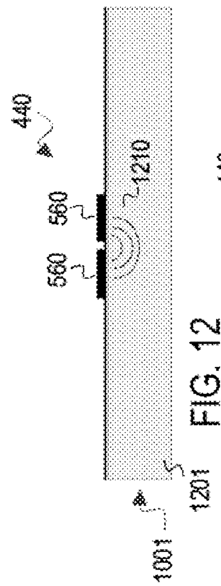
FIG. 12 is a side view of a nonlinear capacitor provided by a nonlinear dielectric substrate according to an exemplary embodiment.
Figure 13:
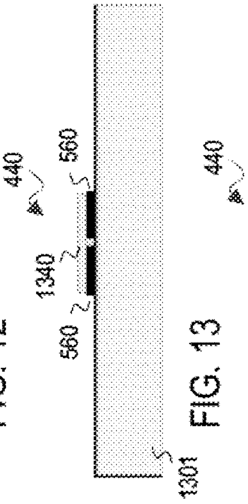
FIG. 13 is a side view of a nonlinear capacitor provided by a nonlinear dielectric overlayer according to an exemplary embodiment.
Figure 14:
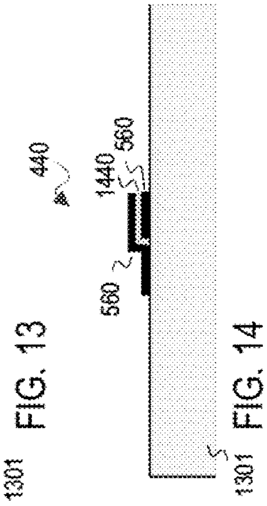
FIG. 14 is a side view of a nonlinear capacitor having an S-ND-S sandwich geometry according to an exemplary embodiment.

FIG. 12 is a side view of a nonlinear capacitor 440 according to an exemplary embodiment with a planar geometry and a tiny gap between superconducting films 560. In the embodiment of FIG. 12, the substrate 1001 is a nonlinear dielectric 1201 and an electric field 1210 couples through the nonlinear dielectric 1201 to create the simple nonlinear capacitor 1040 or the interdigitated nonlinear capacitor 1140. FIG. 13 is a side view of a nonlinear capacitor 440 according to an exemplary embodiment where the substrate 1001 is a linear dielectric material 1301 (e.g., $LaAlO_3$). In the embodiment of FIG. 13, a nonlinear dielectric overlayer 1340 (e.g., STO or charge density wave material) provides nonlinear capacitive coupling. FIG. 14 is a side view of a nonlinear capacitor 440 according to an exemplary embodiment where a nonlinear dielectric film 1440 is sandwiched between the two superconducting films 560 to achieve nonlinear capacitive coupling.

Figure 15:
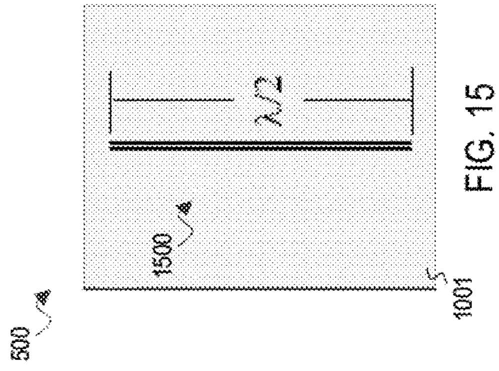
FIG. 15 is a top-down view of a modified half-wavelength coplanar resonator according to an exemplary embodiment.
Figure 16:
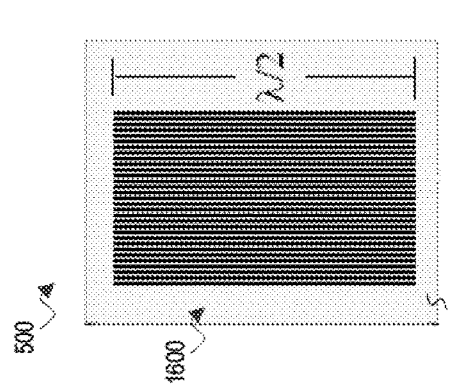
FIG. 16 is a top-down view of a modified half-wavelength coplanar resonator according to another exemplary embodiment.

FIGS. 15 and 16 are top-down views of alternative designs in which modified half-wavelength (λ/2) coplanar resonator 1500 or 1600 with nonlinear properties function as ND-superconducting qubits 500. In the open resonators 1500 and 1600 shown in FIGS. 15 and 16, the greatest capacitive coupling (as well as the greatest nonlinear response for small voltage amplitudes) occurs across the tiny gap(s) via the nonlinear dielectric substrate 1201 as shown in FIG. 12. However, the nonlinear capacitive coupling may also be accomplished via other geometries, such as the overlayer 1340 shown in FIG. 13 or the S-ND-S sandwich geometry shown in FIG. 14.

Figure 17:
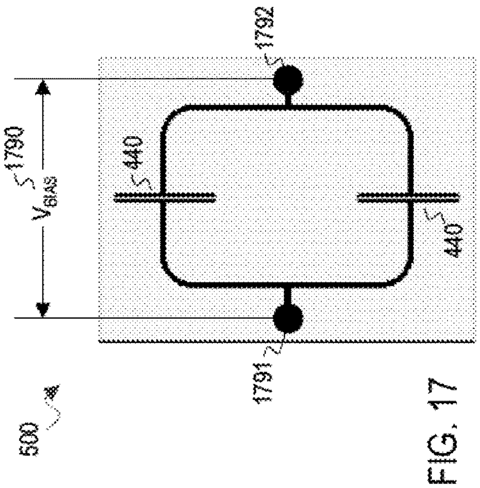
FIG. 17 is a top-down view of a frequency tunable ND-superconducting qubit according to exemplary embodiment.

FIG. 17 is a top-down view of an ND-superconducting qubit 500 according to an exemplary embodiment that includes two nonlinear capacitors 440 (e.g., simple nonlinear capacitors 1040 or interdigitated nonlinear capacitors 1140). In the embodiment of FIG. 17, a DC bias voltage 1790 may be applied across two terminals 1791 and 1972 to change the dielectric constant and adjust the dominant resonant frequency of the qubit 500, which is preferable to doing so by applying an external flux Φ as is typically done with a SQUID 160 as described above with reference to FIGS. 1 and 2B.

Strontium Titanate

Ferroelectric, incipient ferroelectric, and quantum paraelectric materials with nonlinear dielectric properties include, for example, $BaTiO_3$, $Ba_{0.5}Sr_{0.5}TiO_3$, $SrTiO_3$ (STO) and more complex doped, thin film, and/or multilayer versions of these and similar materials. The use of strontium titanate (STO) as the nonlinear capacitive material 440 is of particular interest for the ND-superconducting qubit 500 because it is often used as a substrate 1301 to epitaxially deposit $YBa_2Cu_3O_{7-x}$ (YBCO) and other high-$T_c$ a superconducting (HTS) thin films, which can be patterned into inductive coils and used as the superconducting inductor 560. Additionally, STO itself can be grown in atomically precise layers using methods such as molecular beam epitaxy (MBE), making it ideal from a manufacturability standpoint.

While STO has the advantage of being easily compatible with YBCO and other superconducting thin films, other nonlinear dielectric materials are compatible with a variety of superconductors and should be considered as being encompassed by this disclosure. Other nonlinear dielectric materials include, for example, pure single crystals, ceramics, doped substrates, thin films, S-ND-S sandwiches, overlayers, and complex multilayers. Multilayers include, for example, those with $SrTiO_3/LaAlO_3$ (STO/LAO) multilayers, which can form a 2D electron gas, sometimes superconducting, at the STO/LAO interface. Other examples of pure and doped nonlinear dielectric materials include, for example, $KTaO_3$, $BaTiO_3$, and $Sr_{1-x}Ba_xTiO_3$, and substrates, thin films, and composite multilayers thereof.

Compatibility With Existing Readout, Coupling, Gating, and Pulse-Sequence Methodologies The disclosed qubits 400 are compatible with the wide array of gating, coupling, readout, and pulse-sequence methodologies that have already been developed for existing superconducting transmon 100, fluxonium 200, and related devices. As with transmon qubits 100, input to and readout from the qubit 400 can occur via another resonator 230 (e.g., as shown in FIG. 2B). The qubit 400 can be weakly coupled (e.g., via capacitive coupling as shown in FIG. 2B, for instance through a larger gap or linear dielectric to minimize nonlinearity) to an input/readout resonator 230 that, in turn, couples to a transmission line. For dispersive coupling the input/readout resonator 230 often has a different resonant frequency vs. that of the qubit 400. Alternatively, one qubit 400 can couple to another qubit, capacitively and/or inductively, to enable gating operations.

Benefits of the Disclosed Qudits

The disclosed qubits 400 (and extensions such as qutrits and other qudits) are expected to have significant, potentially game-changing advantages over existing technologies.

The primary benefit is that the disclosed qubits 400 can operate at significantly higher temperatures than existing quantum computing technologies due to reduced quasiparticle poisoning and collective quantum behavior that enhance thermal robustness. Large charge density wave Peierls energy gaps, for instance, greatly suppress quasiparticle poisoning, a major source of decoherence. Converted to temperature, the BCS energy gap for superconducting aluminum corresponds to about 4.2 K, as compared to Peierls gaps of about 2000 K in some charge density waves. Thus, one would expect comparable quasiparticle poisoning at about 7 K for the disclosed qubit 400, which is vastly easier to attain (for example, using a small cryostat) than the 10-20 mK temperatures needed for existing technologies (that require large dilution refrigerators).

Moreover, the operating frequency range of the disclosed qubit 400 may be much larger than existing transmon qubits 100, which alone would enable a 10-fold or greater increase in operating temperature (even without taking the macroscopic mode occupation into account). Additionally, tunable dielectric materials 440 are being developed (e.g., for 6G communication) that operate at even higher frequencies (e.g., several hundred gigahertz), which would further increase the operating temperature of the qubits 400.

Furthermore, due to coherence among many parallel charge density wave chains (or phonons in a quantum paraelectric, etc.) within the condensate of the nonlinear capacitor 440, the disclosed qubit 400 is expected to behave as a macroscopically occupied ensemble of many qubits, acting in concert. For example, the "quantum" of charge for a fluidic charge density wave soliton domain wall is 2eN, where N is the large (e.g., approximately $10^9$) number of parallel chains in the crystal. That condensation (macroscopic occupation) of many boson-like entities (e.g., phonons, electron-phonon correlates, etc.) within the |0> and |1> qubit states is expected to significantly increase the operating temperature and improve coherence times.

Accordingly, the use of nonlinear dielectric materials 440 (instead of Josephson junctions 168) expands the range of superconductors that can be incorporated into the quantum computer, including those with higher critical temperatures and larger BCS energy gaps than are used in existing quantum computers.

Additionally, the disclosed qubits 400 are also easier to manufacture uniformly than existing qubits, making them easier to manufacture at scale. The Josephson junctions 168 used in transmons 100, for example, typically employ oxide insulating barriers that are approximately 1.8 nanometers thick. Variations in the thickness and/or junction area are major contributing factors to variations in kinetic inductance, which hinder the scalability of existing transmons 100. By contrast, nonlinear dielectric gap sizes in range of 20 nm are expected to provide sufficient capacitance and nonlinearity for the disclosed qubits 400. The use of thicker nonlinear dielectric components will make it easier to uniformly manufacture the disclosed qubits 400 at scale than existing qubits.

Finally, the disclosed qubits 400 are compatible with the wide array of gating, coupling, readout, and pulse-sequence methodologies that have already been developed for existing superconducting transmon 100, fluxonium 200, and related devices. That compatibility with existing technology provides significant advantages for design and scalability as compared to other proposed technologies, such as topological quantum computing based on Majorana fermions.

Accordingly, the disclosed qubits 400 have the potential to significantly reduce the cost and increase the scalability of quantum computing technology. Additionally, the include disclosed qubits 400 may have other applications outside the field quantum computing, such as exquisitely sensitive sensors (for example, RF resonators and preamplifiers may be used to detect the emitted RF magnetic fields in magnetic resonance imaging).

While preferred embodiments have been described above, those skilled in the art who have reviewed the present disclosure will readily appreciate that other embodiments can be realized within the scope of the invention. Accordingly, the present invention should be construed as limited only by any appended claims.

What is claimed is:

1. A qudit, comprising:

a nonlinear capacitor comprising nonlinear dielectric material; and an inductance coupled to the nonlinear capacitor, wherein the nonlinear capacitor and the inductance form a nonlinear resonator that enables unequal spacing between quantized energy levels when cooled.

2. The qudit of claim 1, wherein the nonlinear dielectric material comprises a material that forms charge density waves, a material that forms spin density waves, a ferroelectric material, an incipient ferroelectric material, or a quantum paraelectric material.

3. The qudit of claim 1, wherein the nonlinear dielectric material comprises $(TaSe_4)_2I$, $K_{0.3}MoO_3$, $TaS_3$, $BaTiO_3$, $Ba_{0.5}Sr_{0.5}TiO_3$, $SrTiO_3$, $NbS_3$, 1T-$TaS_2$, and $KTaO_3$.

4. The qudit of claim 1, wherein the inductance coupled to the nonlinear capacitor comprises an array of Josephson junctions in series.

5. The qudit of claim 1, wherein the inductance coupled to the nonlinear capacitor comprises a superconductive film patterned on a substrate to form a loop.

6. The qudit of claim 5, wherein the substrate comprises the nonlinear dielectric material and the nonlinear capacitor comprises portions of the superconductive film electric field coupled through the nonlinear dielectric substrate.

7. The qudit of claim 5, wherein the nonlinear capacitor comprises the nonlinear dielectric material, patterned to form a nonlinear dielectric overlayer, over portions of the superconductive film.

8. The qudit of claim 5, wherein the nonlinear capacitor comprises the nonlinear dielectric material sandwiched between two portions of the superconductive film.

9. The qudit of claim 1, wherein the inductance coupled to the nonlinear capacitor is an intrinsic kinetic inductance of the nonlinear dielectric material.

10. The qudit of claim 1, wherein the inductance coupled to the nonlinear capacitive material is a non-superconducting metal inductor.

11. A method of making a qudit, the method comprising:

forming a nonlinear capacitor comprising nonlinear dielectric material; and coupling the nonlinear capacitor to an inductance to form a nonlinear resonator that enables unequal spacing between quantized energy levels when cooled.

12. The method of claim 11, wherein the nonlinear dielectric material comprises a material that forms charge density waves, a material that forms spin density waves, a ferroelectric material, an incipient ferroelectric material, or a quantum paraelectric material.

13. The method of claim 11, wherein the nonlinear dielectric material comprises $(TaSe_4)_2I$, $K_{0.3}MoO_3$, $TaS_3$, $BaTiO_3$, $Ba_{0.5}Sr_{0.5}TiO_3$, $SrTiO_3$, $NbS_3$, 1T-$TaS_2$, and $KTaO_3$.

14. The method of claim 11, wherein coupling the nonlinear capacitor to the inductance comprises coupling the nonlinear capacitor to an array of Josephson junctions in series.

15. The method of claim 11, wherein coupling the nonlinear capacitor to the inductance comprises:

patterning a superconductive film to form a loop; and coupling the nonlinear capacitor to the superconductive film.

16. The method of claim 15, wherein coupling the nonlinear capacitor to the superconductive film comprises:

forming a substrate comprising the nonlinear dielectric material; and patterning the superconductive film on the substrate comprising the nonlinear dielectric material such that an electric field couples portions of the superconductive film through the nonlinear dielectric substrate.

17. The method of claim 15, wherein coupling the nonlinear capacitor to the superconductive film comprises patterning the nonlinear dielectric material to form a nonlinear dielectric overlayer over portions of the superconductive film.

18. The method of claim 15, wherein coupling the nonlinear capacitor to the superconductive film comprises sandwiching the nonlinear dielectric material between portions of the superconductive film.

19. The method of claim 11, wherein coupling the nonlinear capacitor to the inductance comprises coupling the nonlinear capacitor to an intrinsic kinetic inductance of the nonlinear dielectric material.

20. The method of claim 11, wherein coupling the nonlinear capacitor to the inductance comprises coupling the nonlinear capacitor to a non-superconducting metal inductor.

* * * * *